(12) United States Patent
Yang et al.

(10) Patent No.: US 10,672,669 B2
(45) Date of Patent: Jun. 2, 2020

(54) STRUCTURE FOR IMPROVING DIELECTRIC RELIABILITY OF CMOS DEVICE

(71) Applicants: Semiconductor Manufacturing International (Shanghai) Corporation, Shanghai (CN); Semiconductor Manufacturing International (Beijing) Corporation, Beijing (CN)

(72) Inventors: Jiaqi Yang, Shanghai (CN); Jie Zhao, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 16/536,150

(22) Filed: Aug. 8, 2019

(65) Prior Publication Data

US 2019/0363025 A1 Nov. 28, 2019

Related U.S. Application Data

(62) Division of application No. 15/894,755, filed on Feb. 12, 2018, now Pat. No. 10,418,287.

(30) Foreign Application Priority Data

Mar. 17, 2017 (CN) .......................... 2017 1 0158434

(51) Int. Cl.
*H01L 27/06* (2006.01)
*H01L 21/306* (2006.01)
(Continued)

(52) U.S. Cl.
CPC ................ *H01L 21/823842* (2013.01); *H01L 21/28088* (2013.01); *H01L 21/3065* (2013.01);
(Continued)

(58) Field of Classification Search
CPC ....... H01L 21/823842; H01L 21/30604; H01L 21/3065; H01L 27/0629; H01L 27/092; H01L 28/20
See application file for complete search history.

(56) References Cited

U.S. PATENT DOCUMENTS

| 10,418,287 B2 | 9/2019 | Yang et al. |
| 2015/0243564 A1 | 8/2015 | Zhao |
| 2016/0225871 A1* | 8/2016 | Cheng ............. H01L 21/823842 |

OTHER PUBLICATIONS

U.S. Appl. No. 15/894,755, Non-Final Office Action, dated Jan. 11, 2019, 8 pages.

* cited by examiner

*Primary Examiner* — Elias Ullah
(74) *Attorney, Agent, or Firm* — Kilpatrick Townsend & Stockton LLP

(57) ABSTRACT

A semiconductor device includes a semiconductor substrate, an interlayer dielectric layer on the semiconductor substrate, a plurality of trenches extending through the interlayer dielectric layer to the semiconductor substrate and comprising a first trench of a PMOS device and a second trench of an NMOS device, a high-k dielectric layer on a bottom and sidewalls of the trenches, a PMOS work function adjustment layer on the high-k dielectric layer in the first trench, an NMOS work function adjustment layer on the high-k dielectric layer in the second trench, and a metal electrode layer on the PMOS work function adjustment layer in the first trench and on the NMOS work function adjustment layer in the second trench.

13 Claims, 10 Drawing Sheets

(51) Int. Cl.
*H01L 21/8238* (2006.01)
*H01L 27/092* (2006.01)
*H01L 29/49* (2006.01)
*H01L 49/02* (2006.01)
*H01L 21/3065* (2006.01)
*H01L 29/51* (2006.01)
*H01L 21/28* (2006.01)
*H01L 29/66* (2006.01)

(52) U.S. Cl.
CPC .... *H01L 21/30604* (2013.01); *H01L 27/0629* (2013.01); *H01L 27/092* (2013.01); *H01L 28/20* (2013.01); *H01L 29/4966* (2013.01); *H01L 29/517* (2013.01); *H01L 29/66545* (2013.01)

STRUCTURE FOR IMPROVING DIELECTRIC RELIABILITY OF CMOS DEVICE

CROSS-REFERENCES TO RELATED APPLICATIONS

The present application is a divisional of U.S. patent application Ser. No. 15/894,755, filed Feb. 12, 2018, which claims priority to Chinese patent application No. 201710158434.8, filed with the State Intellectual Property Office of People's Republic of China on Mar. 17, 2017, the contents of which are incorporated herein by reference in their entirety.

FIELD OF THE INVENTION

The present disclosure relates to semiconductor technology, and more particularly to a semiconductor device having improved dielectric reliability and manufacturing method of the same.

BACKGROUND OF THE INVENTION

With the development of integrated circuit technology, the feature size of semiconductor devices is getting smaller and smaller. Current complementary metal-oxide semiconductor (CMOS) devices use a high dielectric-constant (high-k) material as the gate dielectric layer and a metal as the gate electrode (HKMG). However, the reduction of the size of MOS semiconductor devices brings many problems.

One problem is that the use of silicon dioxide as a gate dielectric layer generates a high gate leakage current due to the tunneling effect. In the case of the same equivalent oxide thickness (EOT) a high-k (high dielectric constant) dielectric material has a physical thickness larger than that of a conventional silicon dioxide, thus, a high-k dielectric material is utilized as a gate dielectric layer to reduce the gate leakage current.

Another problem is that the depletion effect of a polysilicon gate and the finite inversion layer capacitance reduce the EOT, thereby degrading the device performance. Thus, a metal gate electrode is used instead of a polysilicon gate to reduce the depletion effect of the polysilicon gate.

In a conventional high-k dielectric last and metal gate last process, trenches for the gates are formed after removing the dummy gates and dummy gate oxide layers. Next, an interface layer (IL) and a high-k dielectric layer are sequentially formed in the trenches. Thereafter, a work function adjustment layer and a metal electrode material layer are sequentially deposited in the trench. A planarization (chemical mechanical polishing) process is then performed on the metal electrode material layer to form a metal electrode.

A bottom anti-reflective coating (BARC) layer has good trench filling capability and can provide a flat surface thanks to its liquid-like properties, thus a BARC layer is widely used in the metal gate last forming process. In the prior art, the BARC layer is formed after forming the high-k dielectric layer and a PMOS work function adjustment layer in the trench, and a photoresist is then formed on the BARC layer. However, the use of dry etching in the BARC layer removal may cause damage to the high-k dielectric layer below the BARC layer, resulting in plasma induced damage (PID) and bulk traps in the high-k dielectric layer. Bulk traps can reduce the high-k dielectric layer reliability, e.g., positive bias temperature instability (PBTI), time dependent dielectric breakdown (TDDB), and other properties.

FIGS. 1A to 1F are cross-sectional views illustrating intermediate stages of a semiconductor device in a conventional manufacturing method as known in the prior art.

Referring to FIG. 1A, a substrate 11 is provided, and an interlayer dielectric layer 12 having two trenches is formed on substrate 11. The two trenches may be formed with a part of a gate-last process. For example, dummy gates and dummy gate oxide layers are first formed, then an interlayer dielectric layer is then formed to separate the dummy gates, and a planarization process is performed on the interlayer dielectric layer. Thereafter, the dummy gates and the dummy gate oxide layers are removed to form the two trenches.

In the subsequent steps, a gate structure of an NMOS device ad a gate structure of a PMOS device are formed in the two trenches, respectively.

Referring to FIG. 1A, an interface layer 101 is formed at the bottom of the trenches, a high-k dielectric layer 102, a cap layer 103, and a silicon cap layer (Si-cap layer) 104 are sequentially formed on interface layer 101 and sidewalls of the trenches.

Thereafter, referring to FIG. 1B, a thermal annealing may be performed to improve the performance of interface layer 101 and high-k dielectric layer 102. Silicon cap layer 104 is then removed by wet etching or a combination of dry etching and wet etching using cap layer 103 as an etch stop layer.

Next, referring to FIG. 1C, a PMOS work function adjustment layer 105 is formed in the trenches. A BARC layer 106 is then formed filling the trenches, and a photoresist 107 is formed on BARC layer 106.

Next, referring to FIG. 1D, photoresist 107 is patterned to expose the trench of the NMOS device. The BARC layer portion exposed in the trench of the NMOS device is then removed by dry etching. During the dry etching process, plasma bombardment (as indicated by the arrows) may cause damage to high-k dielectric layer 102.

Next, referring to FIG. 1E, photoresist 107 on the trench of the PMOS device is removed, and then PMOS work function layer 105 in the trench of the NMOS device is removed. Thereafter, BARC layer 106 in the trench of the PMOS device is removed by dry etching. During the dry etching process, plasma bombardment may further cause damage to high-k dielectric layer 102 in the trench of the NMOS device and to high-k dielectric layer 102 in the trench of the PMOS device.

Thereafter, referring to FIG. 1F, an NMOS work function adjustment layer 108 and a metal electrode layer 109 are subsequently formed in the trenches.

As described above, the removal of the BARC layer by dry etching may cause damage to the high-k dielectric layer and degrade the reliability of the high-k dielectric layer, thereby adversely affecting the device performance.

BRIEF SUMMARY OF THE INVENTION

In view of the above problems, embodiments of the present invention provide novel semiconductor structures and manufacturing methods thereof for improving the high-k dielectric reliability.

According to some embodiments of the present invention, a method of manufacturing a semiconductor device may include:
(a) providing a substrate structure including a semiconductor substrate, an interlayer dielectric layer on the semiconductor substrate, a plurality of trenches extending through the interlayer dielectric layer to the semiconductor substrate and comprising a first trench of a PMOS device and a second trench of an NMOS device, and a high-k dielectric layer on sidewalls and a bottom of the trenches;

(b) forming a semiconductor layer filling the trenches;

(c) removing the semiconductor layer in the first trench;

(d) forming a PMOS work function adjustment layer in the first trench and a first metal electrode layer on the PMOS work function adjustment layer in the first trench;

(e) removing the semiconductor layer in the second trench; and (f) forming an NMOS work function adjustment layer in the second trench and a second metal electrode layer on the NMOS work function adjustment layer in the second trench.

In one embodiment, the plurality of trenches further include a third trench of a resistor filled with the semiconductor layer.

In one embodiment, removing the semiconductor layer in the first trench includes:

(c1) forming a patterned first mask on the semiconductor layer in the trenches while exposing the semiconductor layer in the first trench;

(c2) removing the exposed semiconductor layer in the first trench using the first mask as a mask; and (c3) removing the first mask.

In one embodiment, removing the semiconductor layer in the second trench includes:

(e1) forming a patterned second mask on the semiconductor layer while exposing the semiconductor layer in the second trench;

(e2) removing the exposed semiconductor layer in the second trench using the second mask as a mask; and (e3) removing the second mask.

In one embodiment, each of the processes of removing the semiconductor layer in the first trench and removing the semiconductor layer in the second trench include using a wet etching process. In one embodiment, the wet etching process includes an etchant containing tetramethylammonium hydroxide (TMAH) or an aqueous ammonia solution.

In one embodiment, removing the semiconductor layer in the first trench includes removing an upper portion of the semiconductor layer in the first trench using a dry etching process; and removing a lower portion of the semiconductor layer in the first trench using a wet etch process.

In one embodiment, removing the semiconductor layer in the second trench includes removing an upper portion of the semiconductor layer in the second trench using a dry etching process; and removing a lower portion of the semiconductor layer in the second trench using a wet etching process.

In one embodiment, the semiconductor layer includes amorphous silicon or undoped polysilicon.

In one embodiment, the method may further include forming an interface layer at the bottom of the trenches, wherein the high-k dielectric layer is on the interface layer and on the sidewalls of the trenches. In one embodiment, the method may also include forming a cap layer on the high-k dielectric layer, wherein the semiconductor layer is on the cap layer.

In one embodiment, the interface layer includes oxide or nitrogen oxide, and the cap layer includes $Ti_xN_{1-x}$, where $0<x<1$.

In one embodiment, the PMOS work function adjustment layer includes $Ti_xN_{1-x}$ ($0<x<1$), TaC, MoN, or TaN. The NMOS work function adjustment layer includes TaC, Ti, Al, or $Ti_xAl_{1-x}$ ($0<x<1$). The high-k dielectric layer includes $La_2O_3$, $TiO_2$, $Ta_2O_5$, $ZrO_2$, BaZrO, $HfO_2$, HfZrO, HfZrON, HfLaO, HfSiO, HfSiON, LaSiO, AlSiO, HfTaO, HfTiO, (Ba, Sr) $TiO_3$ (BST), $Al_2O_3$, $Si_3N_4$, or oxynitride.

Embodiments of the present invention also provide a semiconductor device. The semiconductor device includes a semiconductor substrate, an interlayer dielectric layer on the semiconductor substrate, a plurality of trenches extending through the interlayer dielectric layer to the semiconductor substrate and comprising a first trench of a PMOS device and a second trench of an NMOS device, a high-k dielectric layer on a bottom and sidewalls of the trenches, a PMOS work function adjustment layer on the high-k dielectric layer in the first trench, an NMOS work function adjustment layer on the high-k dielectric layer in the second trench, and a metal electrode layer on the PMOS work function adjustment layer in the first trench and on the NMOS work function adjustment layer in the second trench.

In one embodiment, the plurality of trenches further include a third trench of a resistor filled with a semiconductor material including amorphous silicon or undoped polysilicon.

In one embodiment, the semiconductor device further includes an interface layer at the bottom of the trenches. The high-k dielectric layer is on the interface layer and on the sidewalls of the trenches.

In one embodiment, the semiconductor device further includes a cap layer on the high-k dielectric layer. The PMOS work function adjustment layer is on the cap layer in the first trench, and the NMOS work function adjustment layer is on the cap layer in the second trench.

In one embodiment, the interface layer includes oxide or nitrogen oxide, and the cap layer includes $Ti_xN_{1-x}$, where $0<x<1$.

In one embodiment, the PMOS work function adjustment layer includes $Ti_xN_{1-x}$ ($0<x<1$), TaC, MoN, or TaN. The NMOS work function adjustment layer includes TaC, Ti, Al, or $Ti_xAl_{1-x}$ ($0<x<1$). The high-k dielectric layer includes $La_2O_3$, $TiO_2$, $Ta_2O_5$, $ZrO_2$, BaZrO, $HfO_2$, HfZrO, HfZrON, HfLaO, HfSiO, HfSiON, LaSiO, AlSiO, HfTaO, HfTiO, (Ba, Sr) $TiO_3$ (BST), $Al_2O_3$, $Si_3N_4$, or oxynitride.

The following detailed description together with the accompanying drawings will provide a better understanding of the nature and advantages of the present invention.

BRIEF DESCRIPTION OF THE DRAWINGS

Embodiments of the present invention are described with reference to the accompanying drawings. In the drawings, like reference numbers may indicate identical or functionally similar elements.

DETAILED DESCRIPTION OF THE INVENTION

Figure 1A:
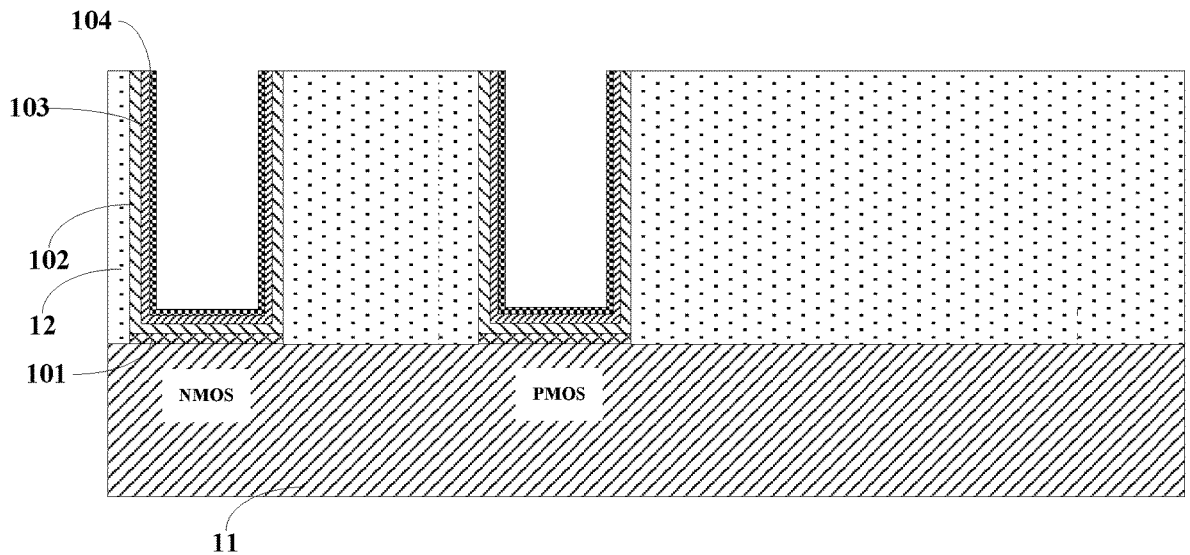
FIGS. 1A to 1F are cross-sectional views illustrating intermediate stages of a semiconductor device in a conventional manufacturing method as known in the prior art.
Figure 1B:
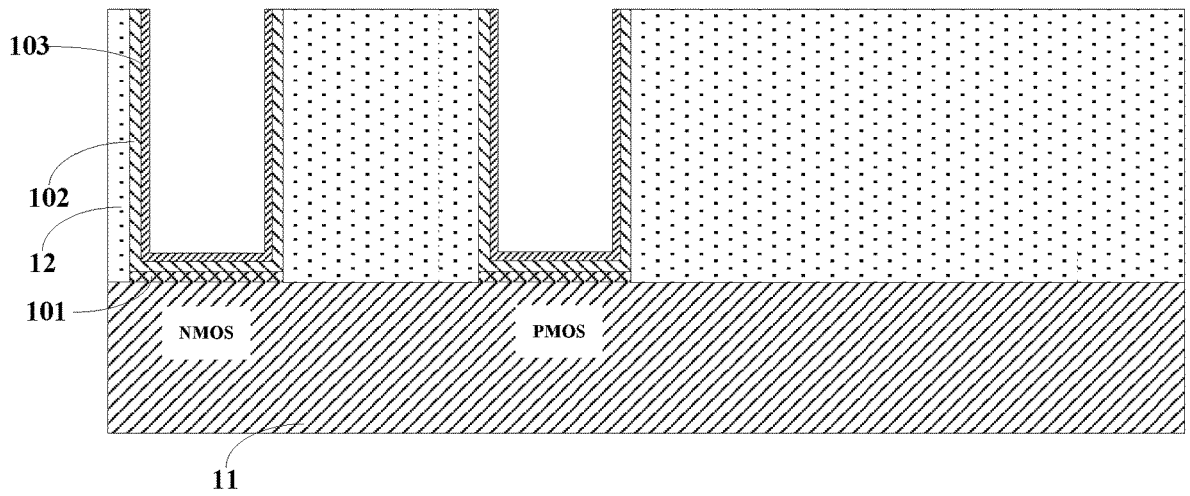
Figure 1C:
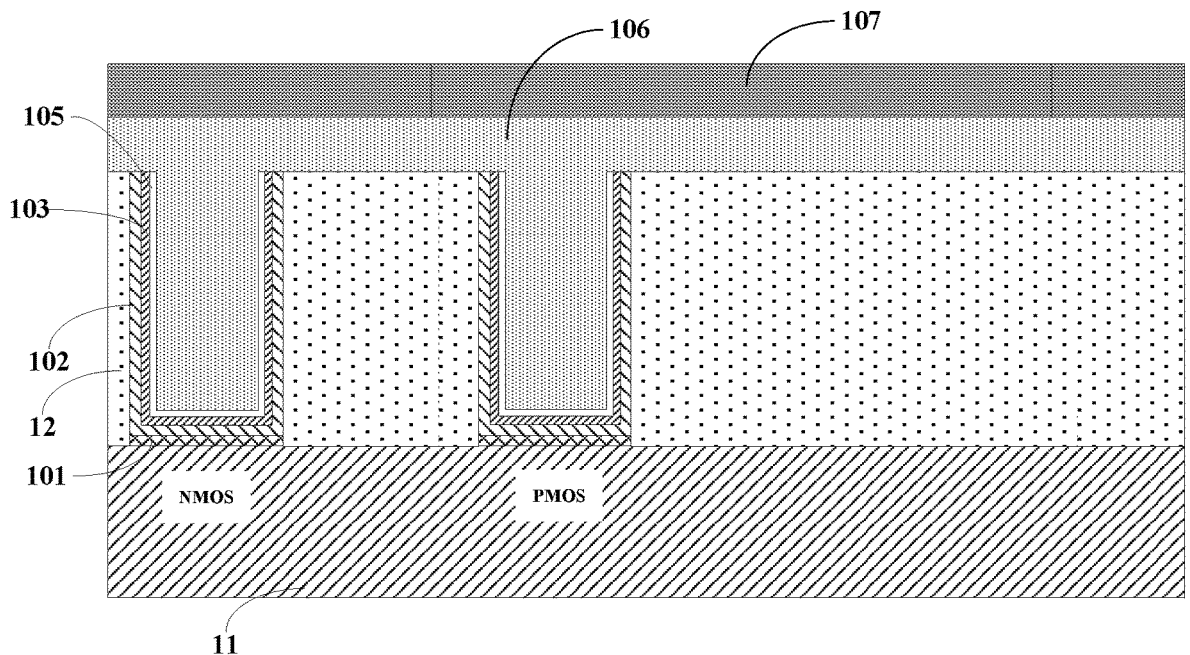
Figure 1D:
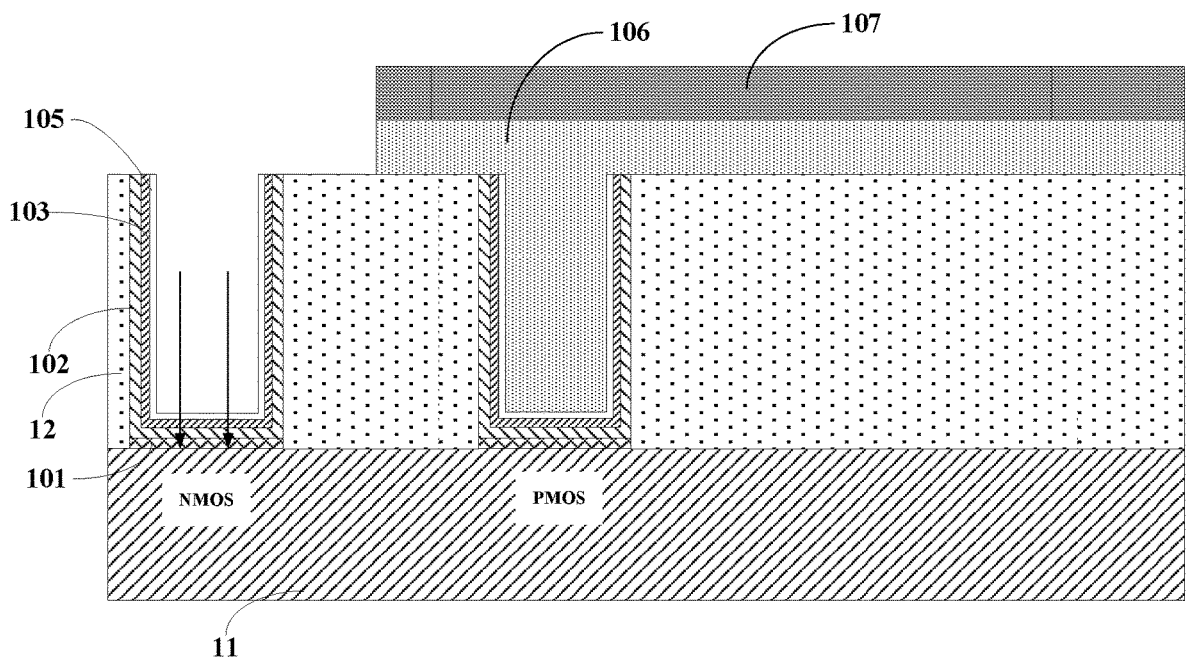
Figure 1E:
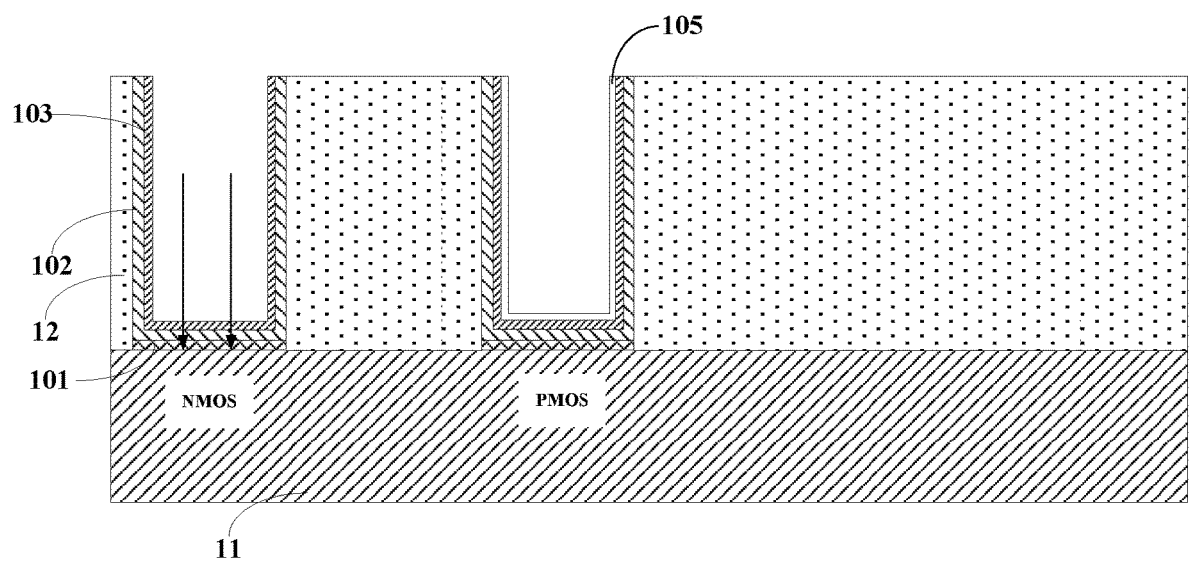
Figure 1F:
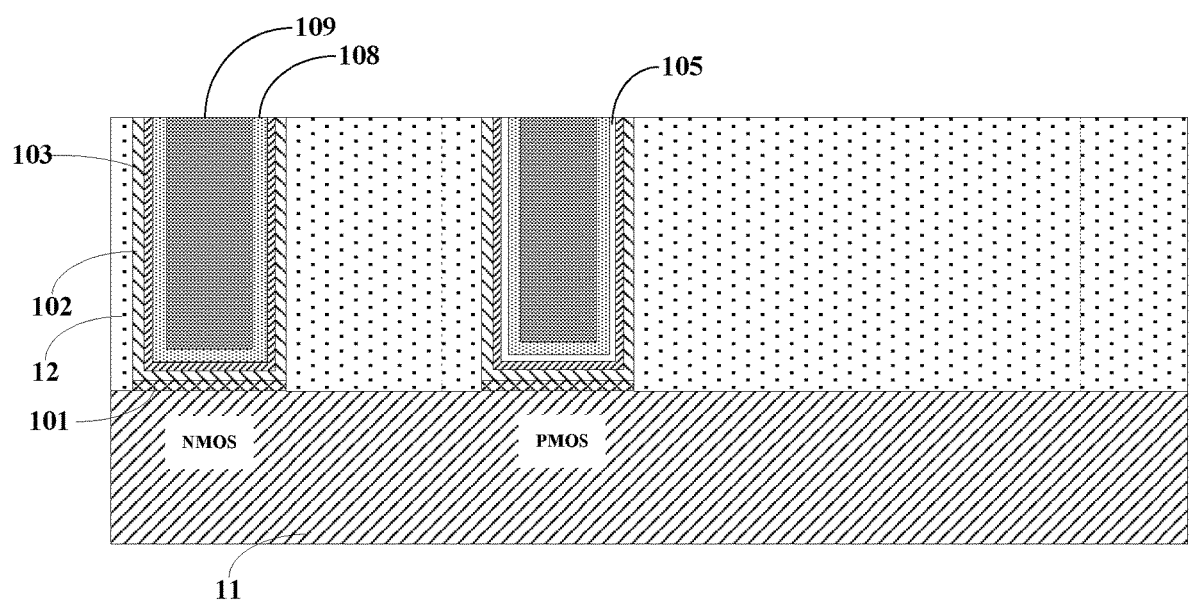

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried, region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The embodiments described and references in the disclosure to "one embodiment," "an embodiment," "an exemplary embodiment" indicate that the embodiments described may include a particular feature, structure, or characteristic. However, every embodiment may not necessary include the particular feature, structure or characteristic. As used throughout this disclosure, the terms "depositing" and "forming" are used interchangeably. The terms "metal material" and "metallic material" are used interchangeably.

Embodiments of the present invention now will be described more fully hereinafter with reference to the accompanying drawings, in which embodiments of the invention are shown. This invention may, however, be embodied in many different forms and should not be construed as limited to the embodiments set forth herein.

Figure 2:
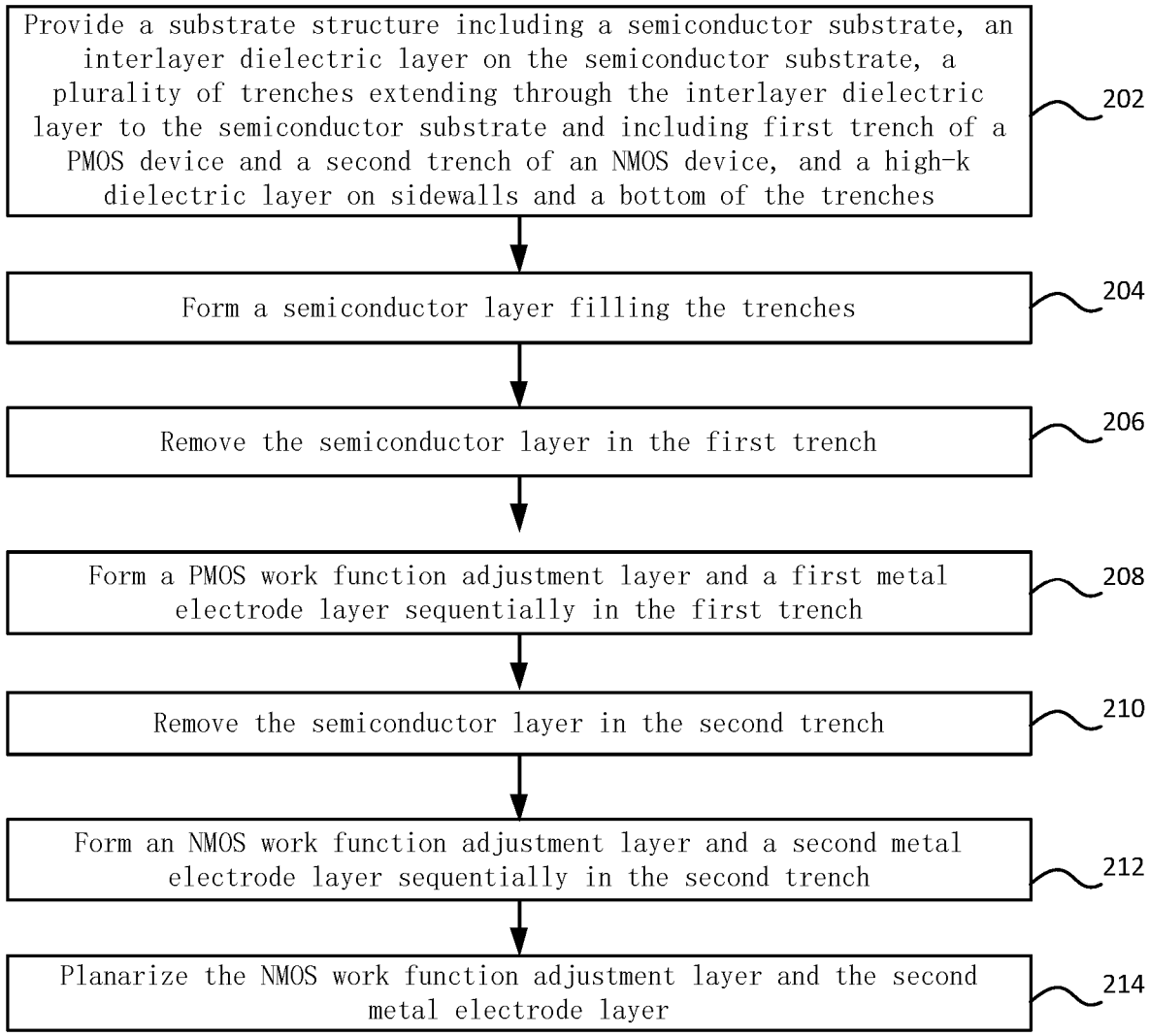
FIG. 2 is a simplified flowchart illustrating a method of manufacturing a semiconductor device according to an embodiment of the present invention.

FIG. 2 is a simplified flowchart illustrating a method of manufacturing a semiconductor device according to an embodiment of the present invention. FIGS. 3A to 3F are cross-sectional views illustrating intermediate stages of a semiconductor device in the manufacturing method according to an embodiment of the present invention.

A manufacturing method of a semiconductor device according to an embodiment of the present invention will be described in detail with reference to FIG. 2 and FIGS. 3A to 3F.

Referring to FIG. 2, a substrate structure is provided in step 202.

Figure 3A:
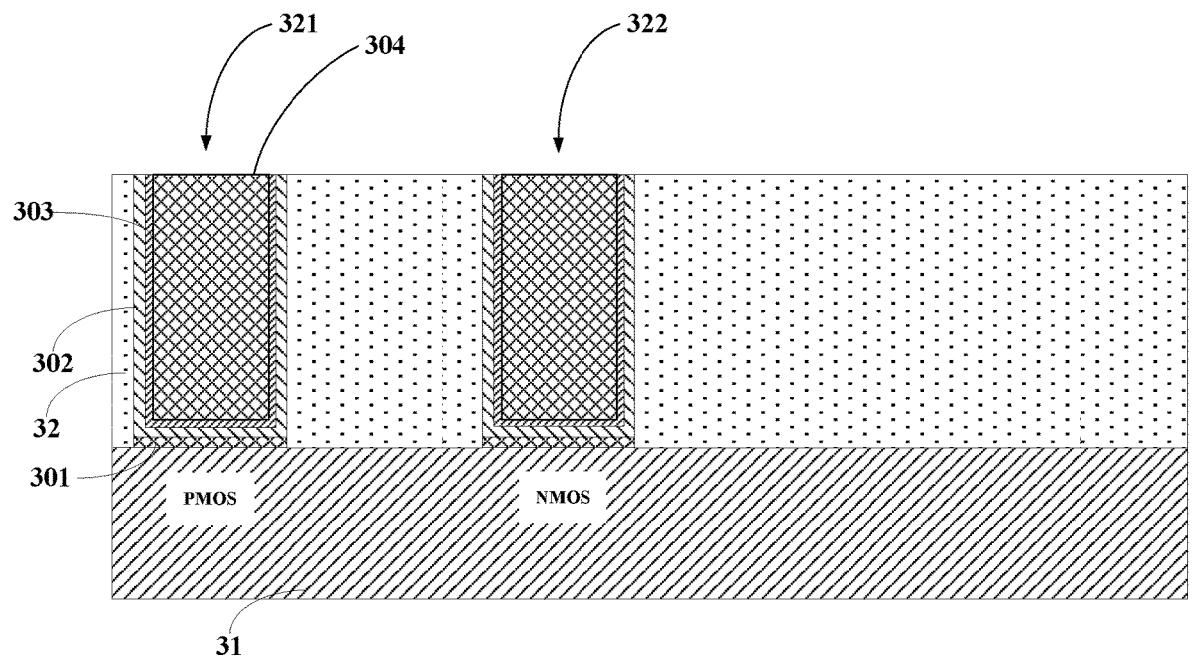
FIGS. 3A to 3F are cross-sectional views illustrating intermediate stages of a semiconductor device in the manufacturing method according to an embodiment of the present invention.

FIG. 3A is a cross-sectional view illustrating a substrate structure in the manufacturing method according to an embodiment of the present invention. Referring to FIG. 3A, the substrate structure includes a semiconductor substrate (e.g., a silicon substrate) 31, an interlayer dielectric layer 32 (e.g., silicon oxide) on semiconductor substrate 31, a plurality of trenches extending through interlayer dielectric layer 32 to semiconductor substrate 31. In the embodiment, the plurality of trenches include a first trench 321 for a PMOS device and a second trench 322 for an NMOS device. The substrate structure also includes a high-k dielectric layer 302 disposed on the surface of semiconductor substrate 31 at the bottom of the trenches and sidewalls of the trenches.

In one embodiment, high-k dielectric layer 302 may include, but not limited to, one of the following materials: $La_2O_3$, $TiO_2$, $Ta_2O_5$, $ZrO_2$, $BaZrO$, $HfO_2$, $HfZrO$, $HfZrON$, $HfLaO$, $HfSiO$, $HfSiON$, $LaSiO$, $AlSiO$, $HfTaO$, $HfTiO$, $(Ba, Sr) TiO_3$ (BST), $Al_2O_3$, $Si_3N_4$, or oxynitride. High-k dielectric layer 302 may be formed using a chemical vapor deposition (CVD), an atomic layer deposition (ALD), or physical vapor deposition (PVD) process. Dielectric layer 302 has a thickness in the range between 10 angstroms and 40 angstroms, e.g., 20 angstroms, 30 angstroms.

In one embodiment, an interface layer 301 may be formed on the surface of semiconductor substrate 21 at the bottom of the trenches, high-k dielectric layer 302 is disposed on interface layer 301 and sidewalls of the trenches. Interface layer 301 may be an oxide or a nitrogen oxide. Interface layer 301 may be formed by thermal oxidation or by deposition such as CVD, ALD, or PVD. The thickness of interface layer 301 is in the range between 5 angstroms and 15 angstroms, e.g., 10 angstroms, 13 angstroms.

In one embodiment, a cap layer 303 is formed on high-k dielectric layer 302 in the trenches. For example, cap layer 303 may be formed by CVD, ALD, or PVD. In one embodiment, cap layer 303 may include, but not limited to, TiN or $Ti_xN_{1-x}$, where $0<x<1$. Cap layer 303 has a thickness in the range of 0 (zero) angstrom (i.e., cap layer 303 is omitted) and 30 angstroms, i.e., 10 angstroms, 20 angstroms. Cap layer 303 may block the diffusion of metal elements (e.g., Al) into high-k dielectric layer 302 to prevent the device stability and other performance parameters from being adversely affected.

Referring back to FIG. 2, in step 204, a semiconductor layer 304 is formed filling the trenches, as shown in FIG. 3A. For example, semiconductor layer 304 is deposited on the substrate structure shown in FIG. 3A, and a planarization (chemical mechanical polishing) process is performed on semiconductor layer 304 until the upper surface of semiconductor layer 304 is substantially flush with the upper surface of interlayer dielectric layer 32. In one embodiment, semiconductor layer 304 may include amorphous silicon or undoped polysilicon. It is noted that, in the case where cap layer 303 is formed on high-k dielectric layer 302, semiconductor layer 304 is disposed on cap layer 303.

Figure 3B:
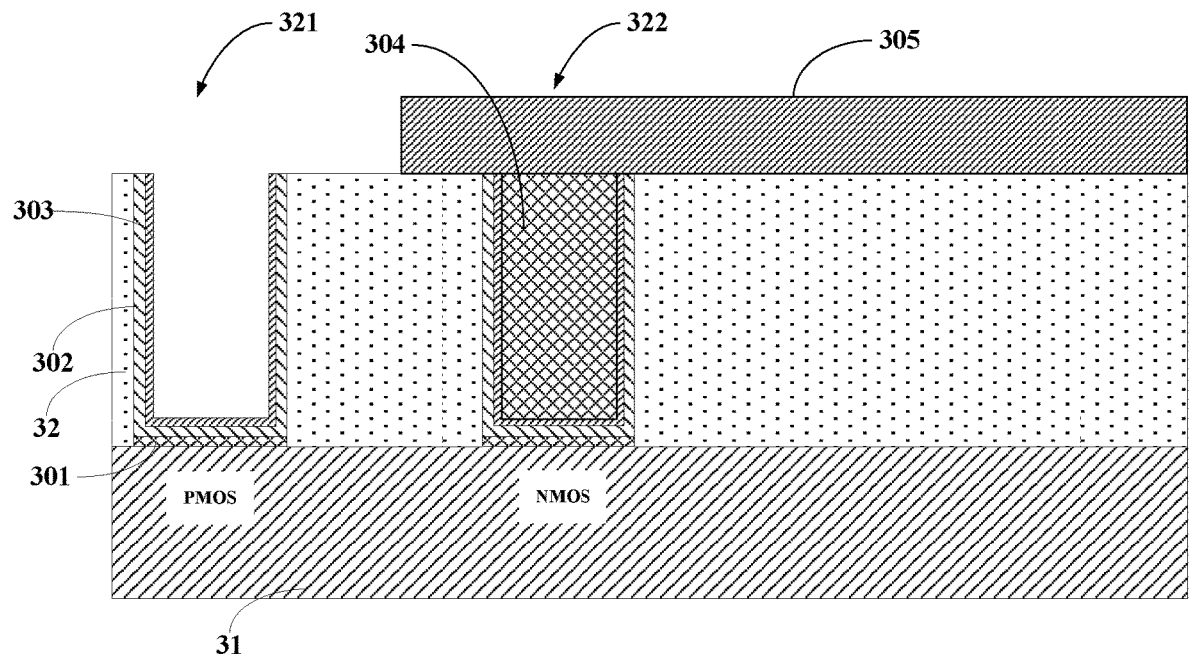

Next, referring to FIG. 2, in step 206, semiconductor layer 304 in first trench 321 is removed, as shown in FIG. 3B. For example, a patterned first mask (e.g., photoresist) 305 may be formed on semiconductor layer 304 in the trenches (e.g., second trench 322) while exposing first trench 321. Semiconductor 304 in first trench 321 is then removed using first mask 305 as a mask. Thereafter, first mask layer 305 is removed, as shown in FIG. 3C.

In one embodiment, semiconductor 304 in first trench 321 may be removed using a wet etching process. The wet etching process may include an etchant including tetramethylammonium hydroxide (TMAH) or an aqueous ammonia solution.

In another embodiment, an upper portion of semiconductor 304 in first trench 321 may be removed using a dry etching process, and a lower portion of semiconductor 304 in first trench 321 may be removed using a wet etching process. Similarly, the wet etching process may include an etchant including TMAH or aqueous ammonia solution. It should be noted that the upper and lower portions of semiconductor 304 in first trench 321 are relative terms, for example, the lower portion of semiconductor 304 may be the portion in the vicinity of the bottom of first trench 321, and the portion above the lower portion is then referred to as the upper portion of semiconductor 304. This definition of the upper portion and the lower portion of semiconductor 304 will be similarly applied to semiconductor 304 in second trench 322 hereinafter.

Figure 3C:
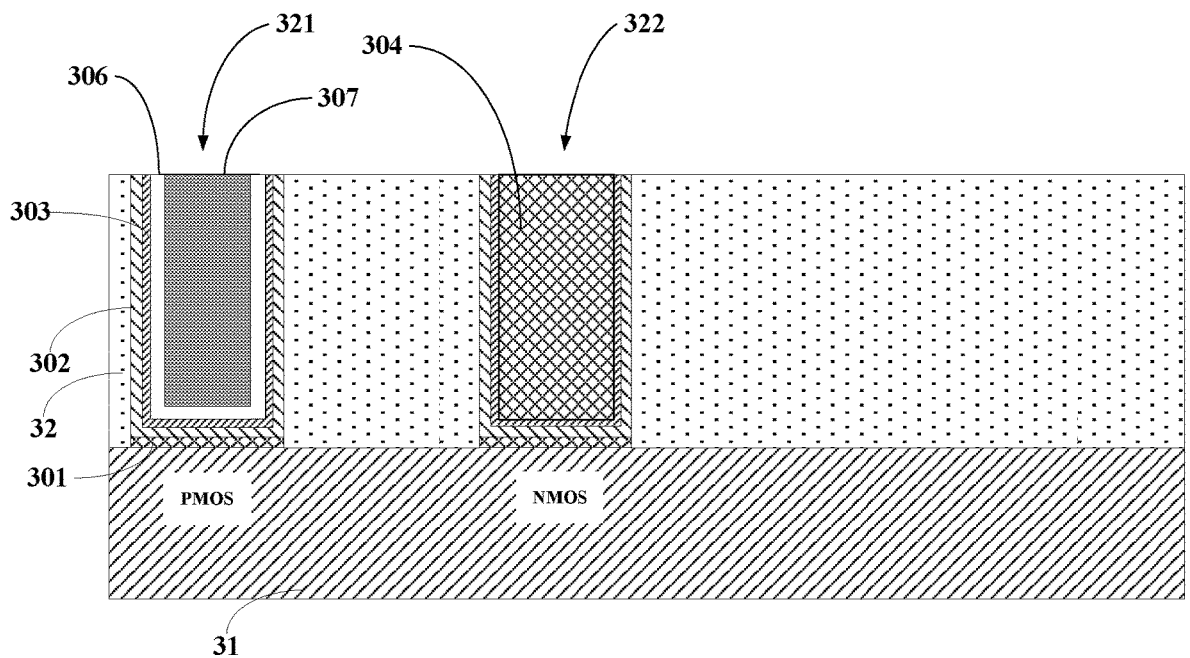

Next, referring to FIG. 2, in step 208, a PMOS work function adjustment layer 306 is formed in first trench 321, and a metal electrode layer 307 is formed on PMOS work function adjustment layer 306, as shown in FIG. 3C.

For example, PMOS work function adjustment layer 306 and metal electrode layer 307 each may be formed by CVD, ALD, or PVD. In one embodiment, PMOS work function adjustment layer 306 may include, but is not limited to, $Ti_xN_{1-x}$ (0<x<1), TaC, MoN, or TaN. The thickness of PMOS work function adjustment layer 306 may be in the range between 10 angstroms and 600 angstroms, e.g., 50 angstroms, 80 angstroms, 200 angstroms, 400 angstroms. Metal electrode layer 307 may include tungsten or aluminum.

Figure 3D:
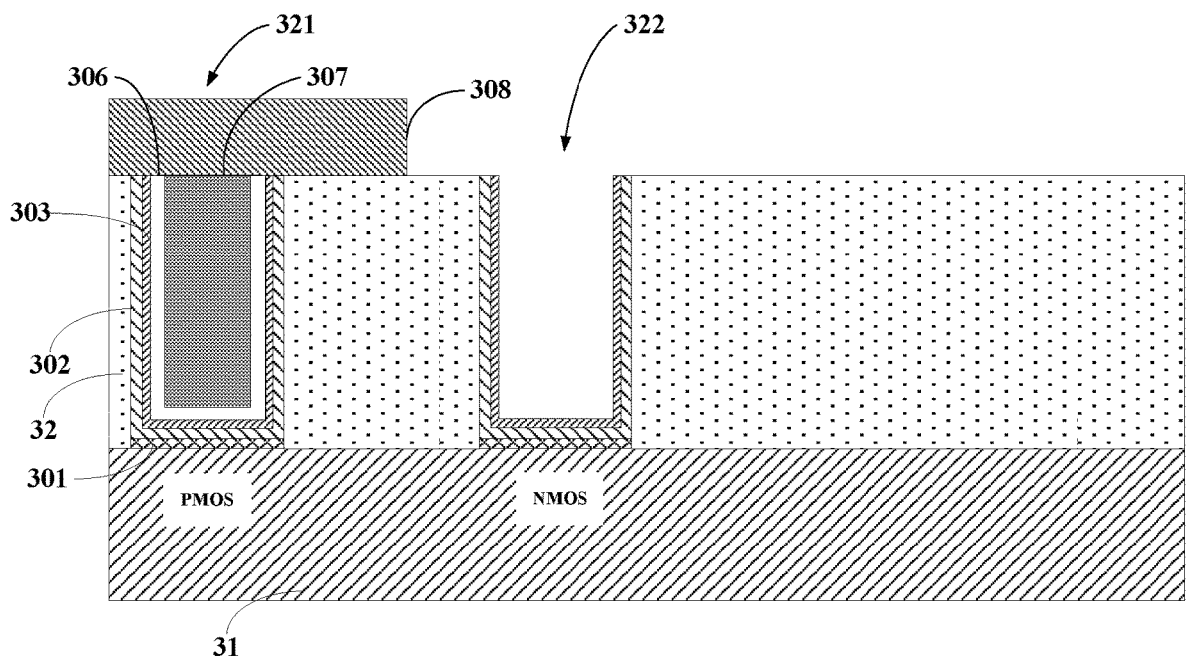

Next, referring to FIG. 2, in step 210, semiconductor layer 304 in second trench 322 is removed, as shown in FIG. 3D. For example, a patterned second mask (e.g., photoresist) 308 may be formed on semiconductor layer 304 in the trenches (e.g., first trench 321) while exposing second trench 322. Semiconductor layer 304 in second trench 322 is then removed using second mask 308 as a mask. Thereafter, second mask layer 308 is removed, as shown in FIG. 3E.

The process of removing semiconductor layer 304 in second trench 322 is similar to the removal process of semiconductor 304 in first trench 321. In one embodiment, semiconductor layer 304 in second trench 322 may be removed using a wet etching process. In another embodiment, an upper portion of semiconductor 304 in second trench 322 may be removed using a dry etching process, and a lower portion of semiconductor 304 in second trench 322 may be removed using a wet etching process. The wet etching process may include an etchant including tetramethylammonium hydroxide (TMAH) or aqueous ammonia solution.

Figure 3E:
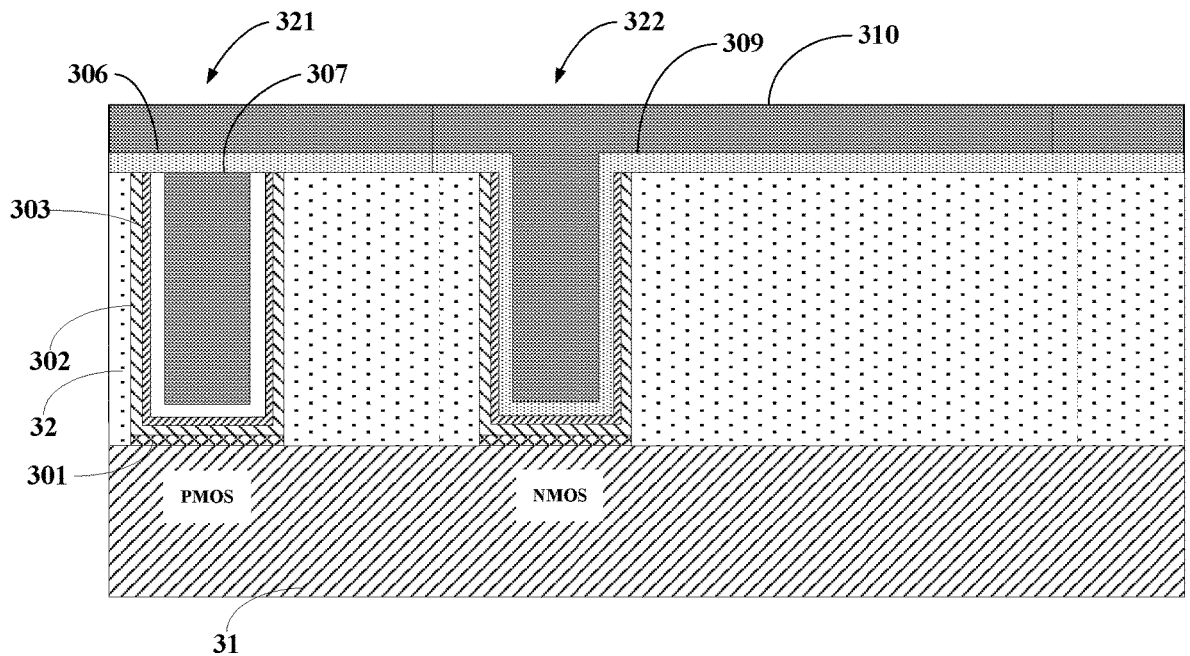

Next, referring to FIG. 2, in step 212, an NMOS work function adjustment layer 309 is formed in second trench 322, and a metal electrode layer 310 is formed on NMOS work function adjustment layer 309 in second trench 322, as shown in FIG. 3E.

Referring to FIG. 3E, after removing second mask 308, NMOS work function adjustment layer 309 and metal electrode layer 310 are sequentially deposited to fill second trench 322. For example, NMOS work function adjustment layer 309 and metal electrode layer 310 each may be formed by CVD, ALD, or PVD. In one embodiment, NMOS work function adjustment layer 309 may include, but is not limited to, TaC, Ti, Al, or $Ti_xAl_{1-x}$, and the thickness of NMOS work function adjustment layer 309 is in the range between 10 angstroms and 100 angstroms, e.g., 20 angstroms, 50 angstroms, 80 angstroms. Metal electrode layer 310 may include tungsten or aluminum.

Figure 3F:
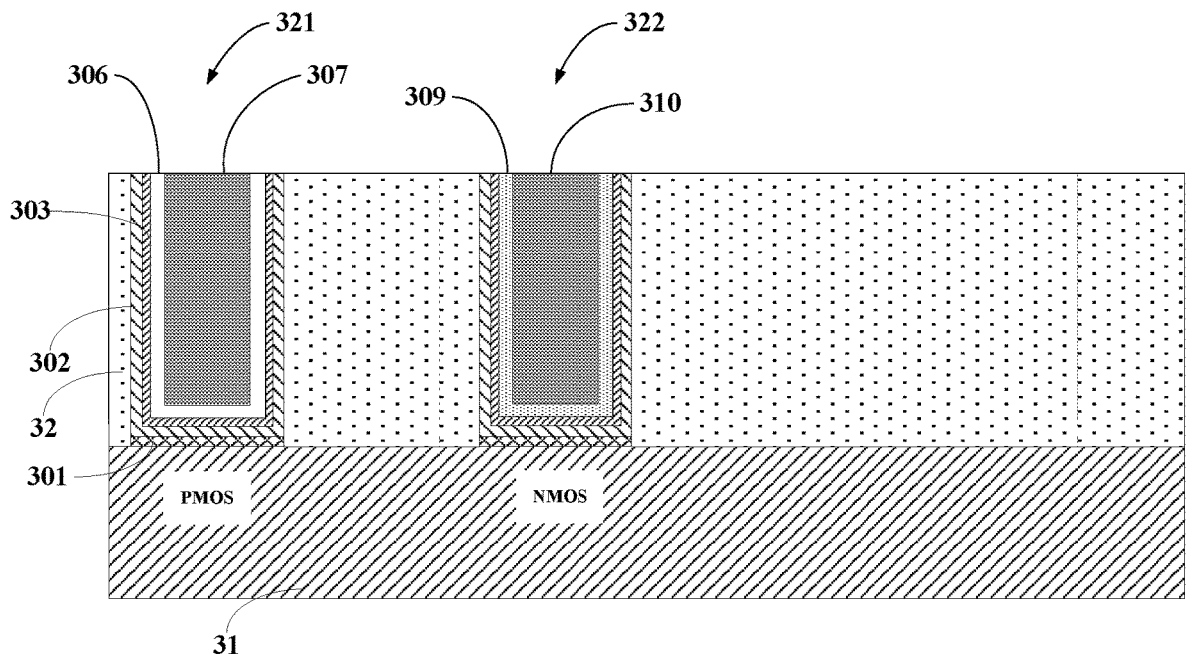

Next, in step 214, referring to FIG. 3F, a planarization (e.g., chemical mechanical polishing) process is performed on NMOS work function adjustment layer 309 and metal electrode layer 310 until an upper surface of NMOS work function adjustment layer 309 and an upper surface of metal electrode layer 310 in second trench 322 are substantially flush with the upper surface of interlayer dielectric layer 32. As used herein, the term "substantially flush" means the surface of a layer is coplanar with the surface of other layer within the manufacturing process variations.

The above-described embodiment of the present invention provides a method of manufacturing a semiconductor device. The manufacturing method of the embodiment is compatible with the prior art process and does not utilize a BARC layer, the method includes filling a semiconductor layer in the trenches, and then form a mask layer on the semiconductor layer. A wet etching process or a wet etching process combined with a dry etching process may be used in the removal of the semiconductor layer to mitigate damage or loss to the high-k dielectric layer below the semiconductor layer and improve the reliability of the high-k dielectric layer.

FIGS. 4A to 4F are cross-sectional views illustrating intermediate stages of a semiconductor device in the manufacturing method according to another embodiment of the present invention. Compared to the embodiment described in FIGS. 3A to 3F, the present embodiment further includes a third trench of a resistor, e.g., a high resistance value resistor (HR). Hereinafter, only the difference between the present embodiment and the embodiment shown in FIGS. 3A to 3F will be described. Elements of similar or same reference numerals will be referred to the above described sections.

Figure 4A:
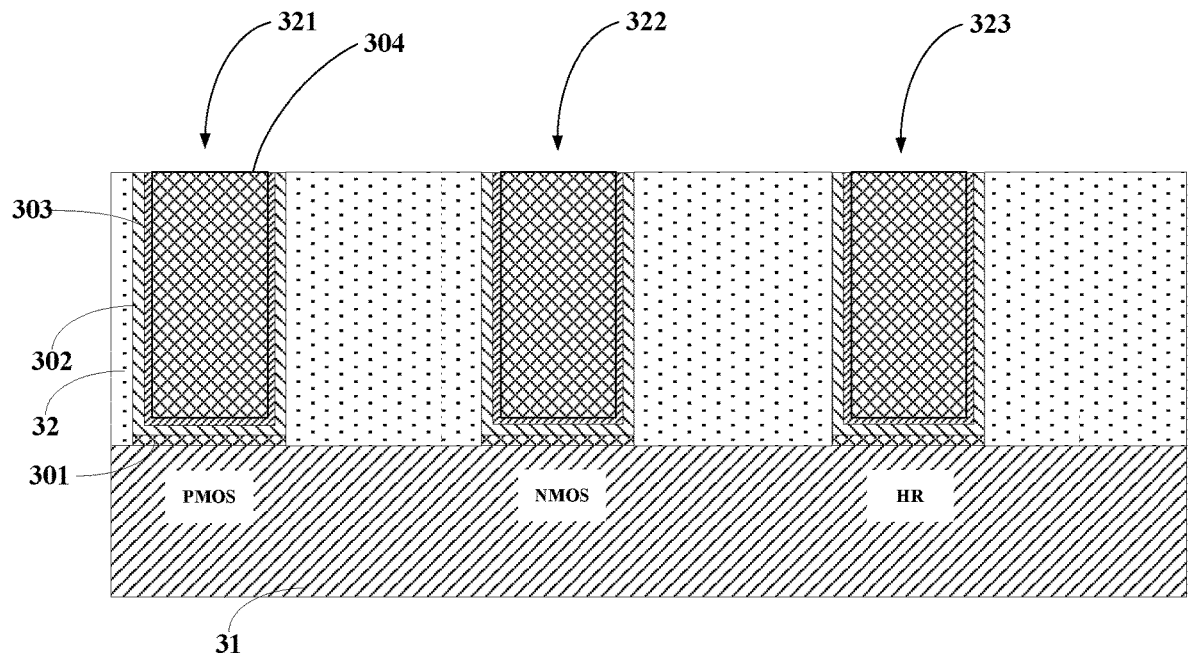
FIGS. 4A to 4F are cross-sectional views illustrating intermediate stages of a semiconductor device in the manufacturing method according to another embodiment of the present invention.

Referring to FIG. 4A, a substrate structure is provided. In one embodiment, the substrate structure includes a semiconductor substrate (a silicon substrate) 31, an interlayer dielectric layer 32 (silicon oxide) on semiconductor substrate 31, a plurality of trenches extending through interlayer dielectric layer 32 to semiconductor substrate 31. In the embodiment, the plurality of trenches include a first trench 321 of a PMOS device, a second trench 322 of an NMOS device, and a third trench 323 of a high resistance value (HR) resistor. The substrate structure also includes a high-k dielectric layer 302 disposed on the surface of semiconductor substrate 31 at the bottom of the trenches and sidewalls of the trenches. The substrate structure also includes a semiconductor layer 304 filling the trenches.

In one embodiment, an interface layer 301 may be formed on the surface of semiconductor substrate 21 at the bottom of the trenches, high-k dielectric layer 302 is disposed on interface layer 301 and sidewalls of the trenches. In one embodiment, a cap layer 303 is formed on high-k dielectric layer 302 in the trenches.

In one embodiment, semiconductor layer 304 may include amorphous silicon or undoped polysilicon. It is noted that, in the case where cap layer 303 is formed on high-k dielectric layer 302, semiconductor layer 304 is formed on cap layer 303.

Figure 4B:
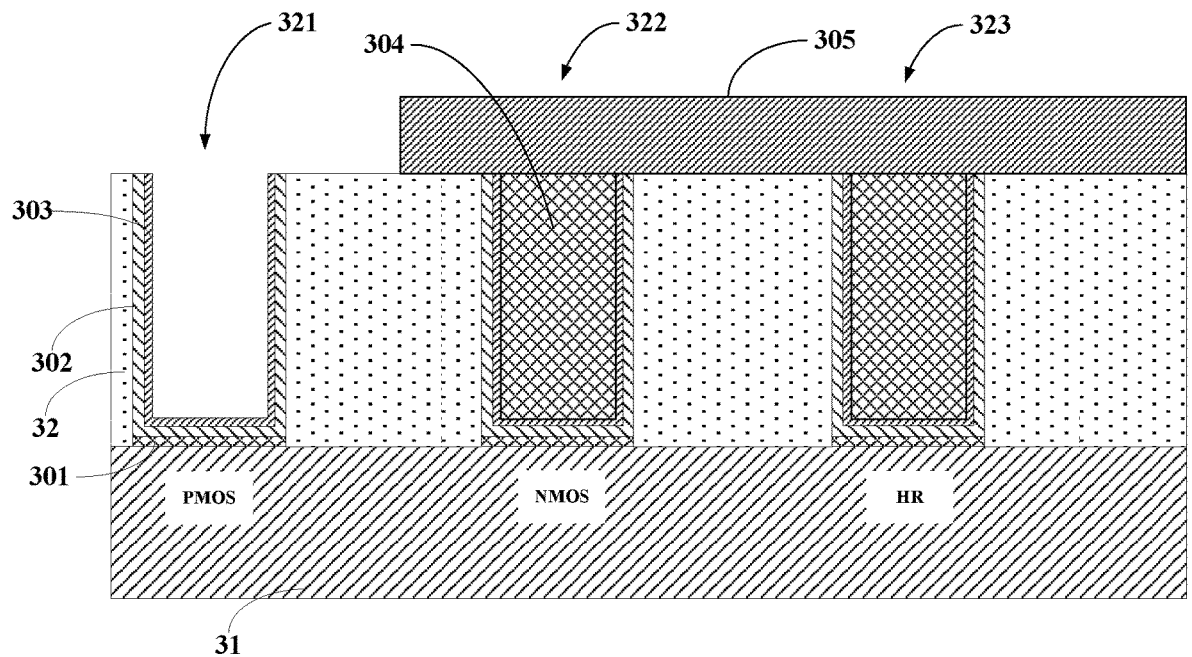

Next, referring to FIG. 4B, semiconductor layer 304 in first trench 321 is removed. For example, a patterned first mask 305 may be formed on semiconductor layer 304 in the trenches while exposing first trench 321, i.e., second and third trenches 322, 323 are covered by first mask 305. Semiconductor layer 304 in first trench 321 is then removed using first mask 305 as a mask. Thereafter, first mask 305 is removed, as shown in FIG. 4C.

In one embodiment, semiconductor 304 in first trench 321 may be removed using a wet etching process. In another embodiment, an upper portion of semiconductor 304 in first trench 321 may be removed using a dry etching process, and a lower portion of semiconductor 304 in first trench 321 may be removed using a wet etching process. The wet etching process may include an etchant including TMAH or an aqueous ammonia solution.

Figure 4C:
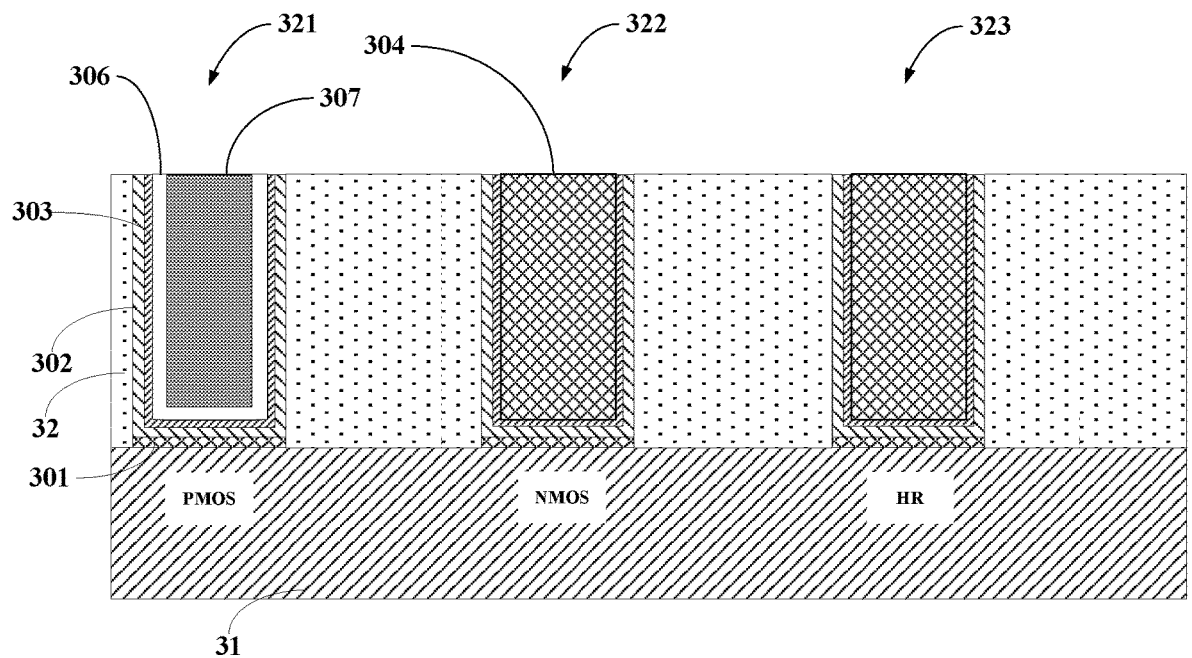

Next, referring to FIG. 4C, a PMOS work function adjustment layer 306 is formed in first trench 321, and a metal electrode layer 307 is formed on PMOS work function adjustment layer 306 in first trench 321.

Figure 4D:
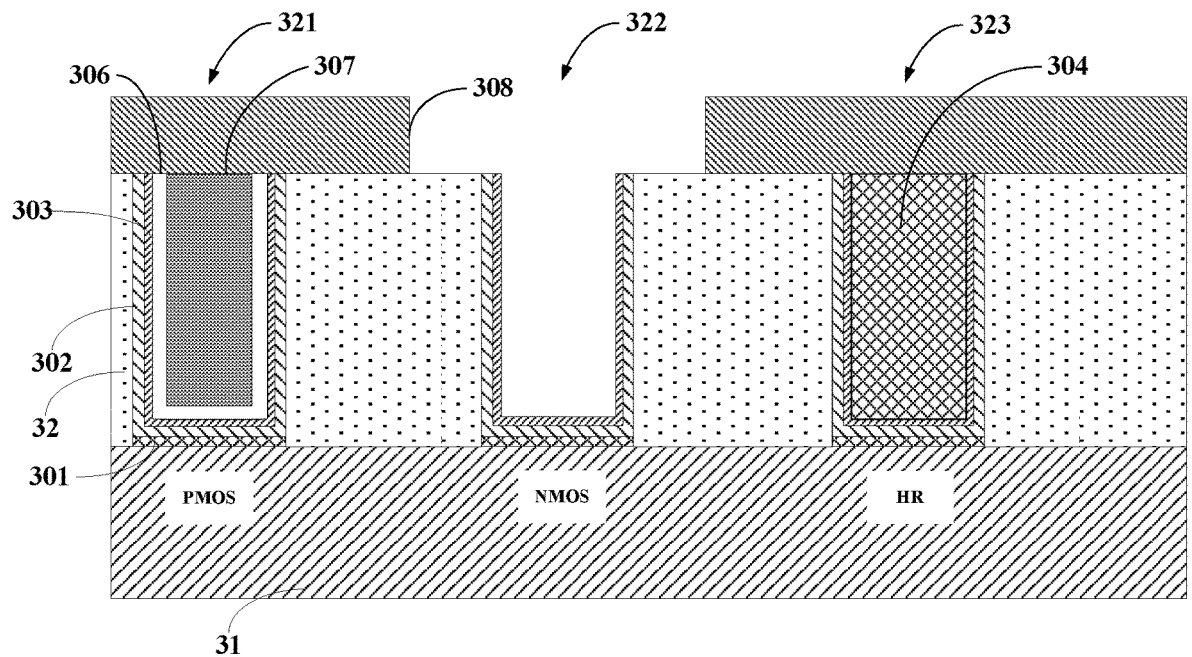

Thereafter, referring to FIG. 4D, semiconductor 304 in second trench 322 is removed. For example, a patterned second mask 308 may be formed on semiconductor layer 304 in the trenches while exposing second trench 322, i.e., first and third trenches 321, 323 are covered by second mask 308. Semiconductor layer 304 in second trench 322 is then removed using second mask 308 as a mask. Thereafter, second mask 308 is removed, as shown in FIG. 4E.

Similar to the removal process of semiconductor 304 in first trench 322, semiconductor 304 in second trench 322 may be removed using a wet etching process in one embodiment. In another embodiment, an upper portion of semiconductor 304 in first trench 321 may be removed using a dry etching process, and a lower portion of semiconductor 304 in first trench 321 may be removed using a wet etching process. The wet etching process may include an etchant including an aqueous solution of TMAH or an aqueous ammonia solution.

Figure 4E:
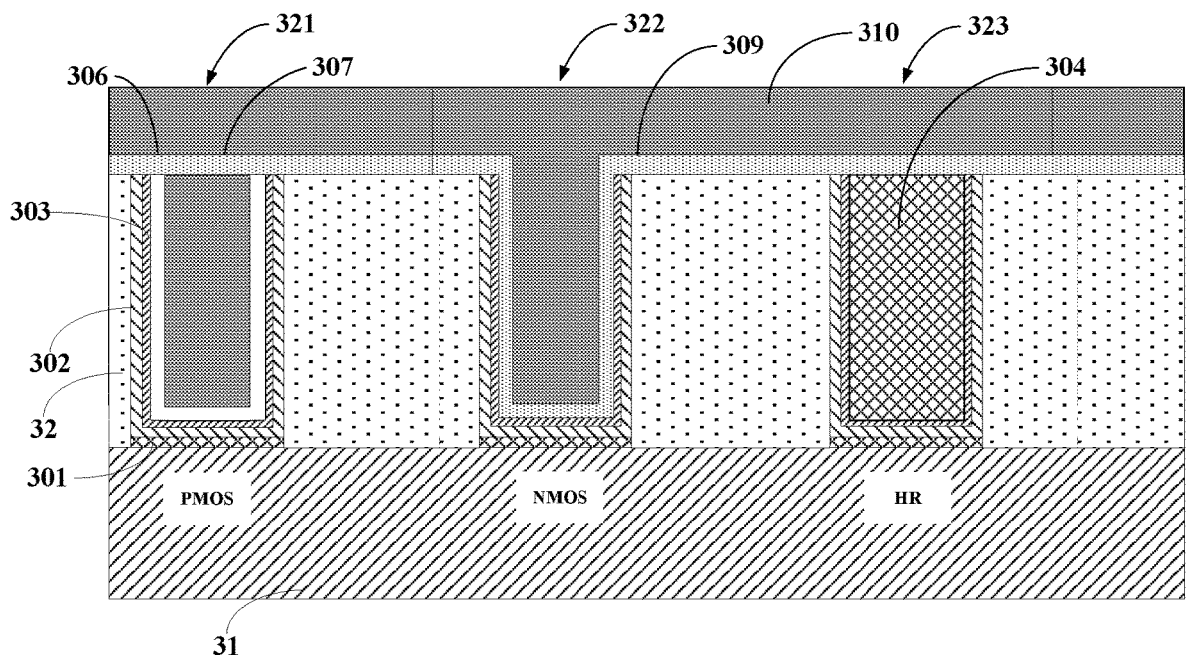

Next, referring to FIG. 4E, an NMOS work function adjustment layer 309 is formed in second trench 322, and a metal electrode layer 310 is formed on NMOS work function adjustment layer 309 in second trench 322. For example, second mask 308 is first removed, NMOS work function adjustment layer 309 is then formed in second trench 322, and thereafter, a metal electrode layer 310 is formed on NMOS work function adjustment layer 309 in second trench 322.

Figure 4F:
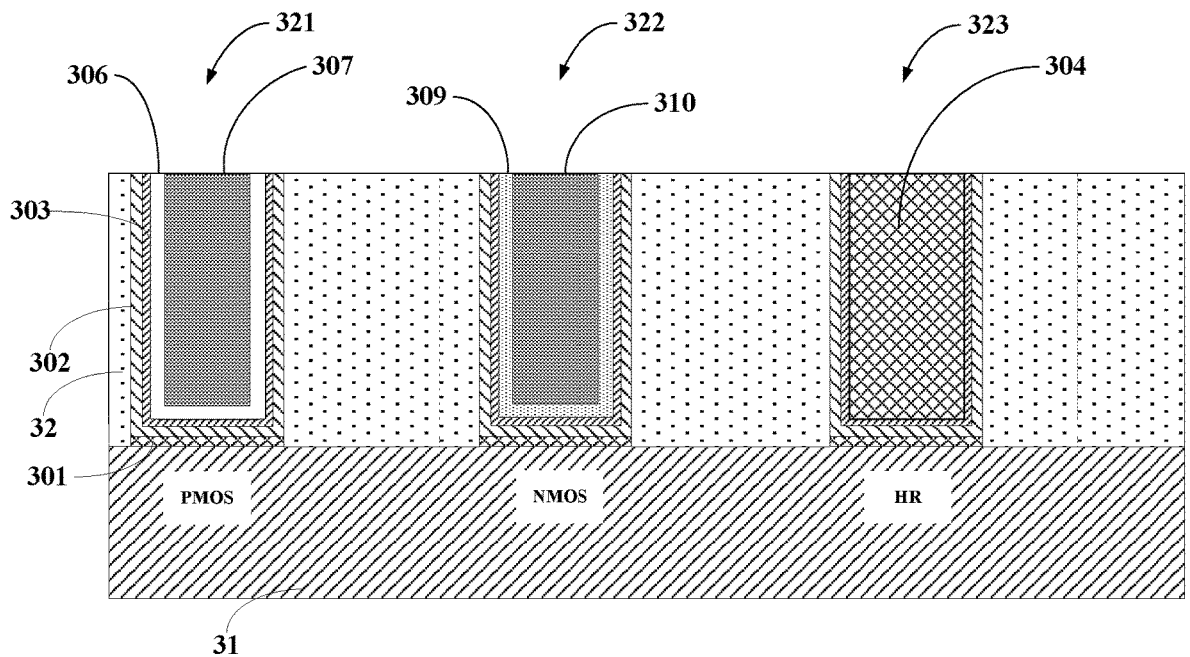

Referring to FIG. 4F, a planarization (e.g., chemical mechanical polishing) process is performed on NMOS work function adjustment layer 309 and metal electrode layer 310 until an upper surface of NMOS work function adjustment layer 309 and an upper surface of metal electrode layer 310 in second trench 322 are substantially flush with the upper surface of interlayer dielectric layer 32.

Another method of manufacturing a semiconductor device has been described according to an embodiment shown in FIGS. 4A to 4F. In the embodiment, the damage of the high-k dielectric layer can be mitigated during the formation of a PMOS device and an NMOS device, and a resistor can also be formed at the same time during the formation of the PMOS device and the NMOS device.

In one embodiment, a resistor having a different resistance value can be obtained by adjusting the depth of third trench 323, i.e., the length or thickness of semiconductor layer 304.

The manufacturing method of the above-described embodiment of the present invention is applicable not only to a planar device, but also to a FinFET device, to a high-k dielectric layer first and gate last (HK first/gate last) process and to a high-k dielectric layer last and gate last (HK last/gate last) process.

Embodiments of the present invention also provide different semiconductor devices.

In one embodiment, referring to FIG. 3F, a semiconductor device includes a semiconductor substrate (e.g., silicon substrate) 31, an interlayer dielectric layer 32 on semiconductor substrate 31, a plurality of trenches extending through interlayer dielectric layer 32 to semiconductor substrate 31. In one embodiment, the plurality of trenches include a first trench 321 of a PMOS device and a second trench 322 of an NMOS device. The semiconductor device further includes a high-k dielectric layer 302 on a surface of semiconductor substrate 31 at the bottom and sidewalls of the trenches. The semiconductor device also includes a PMOS work function layer 306 on high-k dielectric layer 302 in first trench 321, and a metal electrode layer 307 on PMOS work function layer 306 in the first trench. The semiconductor device also includes an NMOS work function layer 309 on high-k dielectric layer 302 in second trench 322, and a metal electrode layer 310 on NMOS work function layer 309 in the second trench.

In another embodiment, referring to FIG. 4F, a semiconductor device includes a semiconductor substrate (e.g., silicon substrate) 31, an interlayer dielectric layer 32 on semiconductor substrate 31, a plurality of trenches extending through interlayer dielectric layer 32 to semiconductor substrate 31. In one embodiment, the plurality of trenches include a first trench 321 of a PMOS device, a second trench 322 of an NMOS device, and a third trench 323 of a resistor. The semiconductor device further includes a high-k dielectric layer 302 on a surface of semiconductor substrate 31 at the bottom and sidewalls of the trenches. The semiconductor device also includes a PMOS work function layer 306 on high-k dielectric layer 302 in first trench 321, and a metal electrode layer 307 on PMOS work function layer 306 in the first trench. The semiconductor device also includes an NMOS work function layer 309 on high-k dielectric layer 302 in second trench 322, and a metal electrode layer 310 on NMOS work function layer 309 in the second trench. The semiconductor device also includes a semiconductor layer 304 on high-k dielectric layer 302 filling third trench 322. In one embodiment, semiconductor layer 304 includes amorphous silicon or undoped polysilicon.

In some embodiments, referring to FIG. 3F or FIG. 4F, the semiconductor device may further include an interface layer 301 disposed on the surface of semiconductor substrate 31 at the bottom of the trenches, high-k dielectric layer 302 is disposed on interface layer 301 and sidewalls of the trenches. Interface layer 301 may include oxide or nitrogen oxide (oxynitride).

In some embodiments, referring still to FIG. 3F or FIG. 4F, the semiconductor device may further include a cap layer 303 is formed on high-k dielectric layer 302 in the trenches. Accordingly, PMOS work function adjustment layer 306 is formed on cap layer 303 in first trench 321, NMOS work function adjustment layer 309 is formed on cap layer 303 in second trench 322. Cap layer 303 may include $Ti_xN_{1-x}$, where $0<x<1$.

In some embodiments, referring still to FIG. 3F or FIG. 4F, PMOS work function adjustment layer 306 may include $Ti_xN_{1-x}$, ($0<x<1$), TaC, MoN or TaN. NMOS work function adjustment layer 309 may include TaC, Ti, Al, or $Ti_xAl_{1-x}$, ($0<x<1$). High-k dielectric layer 302 may include $La_2O_3$, $TiO_2$, $Ta_2O_5$, $ZrO_2$, BaZrO, $HfO_2$, HfZrO, HfZrON, HfLaO, HfSiO, HfSiON, LaSiO, AlSiO, HfTaO, HfTiO, (Ba, Sr) $TiO_3$ (BST), $Al_2O_3$, $Si_3N_4$, or oxynitride.

The foregoing descriptions of specific embodiments of the present invention have been presented for purpose of illustration and description. They are not intended to be exhaustive or to limit the invention to the precise forms disclosed, and obviously many modifications and variations are possible in light of the above disclosure. The exemplary embodiment has been described in order to best explain the principles of the invention and its practical application. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A semiconductor device, comprising:
   a semiconductor substrate;
   an interlayer dielectric layer on the semiconductor substrate;
   a plurality of trenches extending through the interlayer dielectric layer to the semiconductor substrate and comprising a first trench of a PMOS device and a second trench of an NMOS device;
   a high-k dielectric layer on a bottom and sidewalls of the trenches;
   a PMOS work function adjustment layer on the high-k dielectric layer in the first trench;
   an NMOS work function adjustment layer on the high-k dielectric layer in the second trench; and
   a metal electrode layer on the PMOS work function adjustment layer in the first trench and on the NMOS work function adjustment layer in the second trench,
   wherein the first trench comprises the PMOS work function adjustment layer without the NMOS work function adjustment layer.

2. The semiconductor device of claim 1, wherein the plurality of trenches further comprise a third trench of a resistor filled with a semiconductor material including amorphous silicon.

3. The semiconductor device of claim 1, wherein the plurality of trenches further comprise a third trench of a resistor filled with a semiconductor material including undoped polysilicon.

4. The semiconductor device of claim 1, further comprising an interface layer at the bottom of the trenches, wherein the high-k dielectric layer is on the interface layer and on the sidewalls of the trenches.

5. The semiconductor device of claim 4, further comprising a cap layer on the high-k dielectric layer, wherein:
   the PMOS work function adjustment layer is on the cap layer in the first trench; and
   the NMOS work function adjustment layer is on the cap layer in the second trench.

6. The semiconductor device of claim 5, wherein:
   the interface layer comprises oxide or nitrogen oxide;
   the cap layer comprises $Ti_xN_{1-x}$, where $0<x<1$.

7. The semiconductor device of claim 1, wherein:
   the PMOS work function adjustment layer comprises $Ti_xN_{1-x}$ ($0<x<1$), TaC, MoN, or TaN;
   the NMOS work function adjustment layer comprises TaC, Ti, Al, or $Ti_xAl_{1-x}$ ($0<x<1$); and
   the high-k dielectric layer comprises $La_2O_3$, $TiO_2$, $Ta_2O_5$, $ZrO_2$, BaZrO, $HfO_2$, HfZrO, HfZrON, HfLaO, HfSiO, HfSiON, LaSiO, AlSiO, HfTaO, HfSiO, (Ba, Sr) $TiO_3$, $Al_2O_3$, $Si_3N_4$, or oxynitride.

8. A semiconductor device, comprising:
   a semiconductor substrate;
   an interlayer dielectric layer on the semiconductor substrate;
   a plurality of trenches extending through the interlayer dielectric layer to the semiconductor substrate and comprising a first trench of a PMOS device and a second trench of an NMOS device;
   an interface layer at a bottom of the trenches and not at sidewalls of the trenches;
   a high-k dielectric layer on the interface layer and the sidewalls of the trenches;
   a PMOS work function adjustment layer on the high-k dielectric layer in the first trench;
   an NMOS work function adjustment layer on the high-k dielectric layer in the second trench; and
   a metal electrode layer on the PMOS work function adjustment layer in the first trench and on the NMOS work function adjustment layer in the second trench,
   wherein the first trench comprises the PMOS work function adjustment layer without the NMOS work function adjustment layer.

9. The semiconductor device of claim 8, wherein the interface layer comprises nitrogen oxide.

10. The semiconductor device of claim 8, wherein the plurality of trenches further comprise a third trench of a resistor filled with a semiconductor material including amorphous silicon or undoped polysilicon.

11. The semiconductor device of claim 8, further comprising a cap layer on the high-k dielectric layer, wherein:
    the PMOS work function adjustment layer is on the cap layer in the first trench; and
    the NMOS work function adjustment layer is on the cap layer in the second trench.

12. The semiconductor device of claim 11, wherein the cap layer comprises $Ti_xN_{1-x}$, where $0<x<1$.

13. The semiconductor device of claim 8, wherein:
    the PMOS work function adjustment layer comprises $Ti_xN_{1-x}$ ($0<x<1$), TaC, MoN, or TaN;
    the NMOS work function adjustment layer comprises TaC, Ti, Al, or $Ti_xAl_{1-x}$ ($0<x<1$).

* * * * *